United States Patent
Yugawa

(10) Patent No.: US 9,237,649 B2
(45) Date of Patent: Jan. 12, 2016

(54) WIRING BOARD AND METHOD OF MANUFACTURING THE SAME

(71) Applicant: KYOCERA SLC Technologies Corporation, Yasu-shi, Shiga (JP)

(72) Inventor: Hidetoshi Yugawa, Kyoto (JP)

(73) Assignee: KYOCERA CIRCUIT SOLUTIONS, INC., Kyoto (JP)

( * ) Notice: Subject to any disclaimer, the term of this patent is extended or adjusted under 35 U.S.C. 154(b) by 0 days.

(21) Appl. No.: 14/285,733

(22) Filed: May 23, 2014

(65) Prior Publication Data

US 2014/0353021 A1 Dec. 4, 2014

(30) Foreign Application Priority Data

May 28, 2013 (JP) .................. 2013-111879
Jul. 30, 2013 (JP) .................. 2013-157267

(51) Int. Cl.
*H05K 1/11* (2006.01)
*H05K 3/00* (2006.01)
*H05K 1/03* (2006.01)
*H05K 3/42* (2006.01)
*H05K 3/46* (2006.01)

(52) U.S. Cl.
CPC .............. *H05K 1/115* (2013.01); *H05K 3/0035* (2013.01); *H05K 1/036* (2013.01); *H05K 1/0373* (2013.01); *H05K 3/421* (2013.01); *H05K 3/4676* (2013.01); *H05K 2201/0209* (2013.01); *H05K 2201/0269* (2013.01); *H05K 2201/068* (2013.01); *H05K 2201/09854* (2013.01); *H05K 2201/2054* (2013.01); *H05K 2201/2072* (2013.01); *H05K 2203/1476* (2013.01)

(58) Field of Classification Search
None
See application file for complete search history.

(56) References Cited

U.S. PATENT DOCUMENTS

| 3,348,990 | A  | * | 10/1967 | Pisan et al. ..................... 156/293 |
| 6,632,512 | B1 | * | 10/2003 | Ito ................................. 428/210 |
| 7,385,472 | B1 | * | 6/2008  | Downes ......................... 336/200 |
| 2003/0166331 | A1 | * | 9/2003 | Tong et al. ..................... 438/613 |
| 2011/0300307 | A1 | * | 12/2011 | Nakai et al. ................... 427/555 |
| 2012/0132462 | A1 | * | 5/2012 | Harazono et al. ............. 174/260 |
| 2013/0062108 | A1 | * | 3/2013 | Kondo ........................... 174/258 |

FOREIGN PATENT DOCUMENTS

JP 2002-252436 A 9/2002

* cited by examiner

*Primary Examiner* — Steven T Sawyer
(74) *Attorney, Agent, or Firm* — Volpe and Koenig, P.C.

(57) ABSTRACT

A wiring board 10 includes a lower wiring conductor 1, an upper insulating layer 2 laminated on the lower wiring conductor 1 and having a via hole 5 where a bottom surface is the lower wiring conductor 1, and a via conductor 3 connected to the lower wiring conductor 1 and filling the via hole 5; and the upper insulating layer 2 includes a first resin layer 2a and a second resin layer 2b sequentially laminated on the lower wiring conductor 1, the via hole 5 has an annular groove 5a over a whole circumference of the inner wall in a boundary between both resin layers 2a and 2b, and the via conductor 3 fills the groove 5.

4 Claims, 3 Drawing Sheets

WIRING BOARD AND METHOD OF MANUFACTURING THE SAME

BACKGROUND OF THE INVENTION

1. Field of the Invention

The present invention relates to a wiring board having a via hole and a method of manufacturing the same.

2. Description of Related Art

As shown in FIG. 3, a wiring board 20 formed by electrically connecting a lower wiring conductor 11 and an upper wiring conductor 14 formed on an upper surface of an upper insulating layer 12 with a via conductor 13 that penetrates the upper insulating layer 12 is known (for example, see Japanese Unexamined Patent Application Publication No. 2002-252436). The via conductor 13 is formed by filling a via hole 15 formed in the upper insulating layer 12 with a plating conductor.

In recent years, in such a wiring board, a micro-wiring pattern is popularly used. For this reason, the via conductor 13 requires a diameter of 40 μm or less. However, when the via conductor 13 has a diameter of 40 μm or less, a contact area between the via conductor 13 and the lower wiring conductor 11 also decreases, and a contact strength therebetween is degraded. For this reason, for example, when heat generated in mounting parts on the wiring board 20 and heat generated in activation of the parts are repeatedly applied, thermal stress caused by a difference between the thermal expansion coefficients of the via conductor 13 and the lower wiring conductor 11 makes cracks between the via conductor 13 and the lower wiring conductor 11 to damage the electric connection between the via conductor 13 and the lower wiring conductor 11, then the wiring board 20 could not function as a wiring board.

SUMMARY OF THE INVENTION

It is an object of the present invention to provide a wiring board having a high-reliable electric connection between a via conductor and a lower wiring conductor connected thereto.

A wiring board according to the present invention includes a lower wiring conductor, an upper insulating layer laminated on the lower wiring conductor and having a via hole where a bottom surface is the lower wiring conductor, and a via conductor that is connected to the lower wiring conductor to fill the via hole. The upper insulating layer has a first resin layer laminated on the lower wiring conductor and a second resin layer laminated on the first resin layer, the via hole has an annular groove formed by recessing the inner wall of the via hole over its whole circumference in a boundary between the first resin layer and the second resin layer, and the via conductor filling the via hole also fills the groove while invading in the groove.

According to the wiring board of the present invention, a via hole has an annular groove formed by recessing the inner wall of the via hole over its whole circumference in the boundary between the first resin layer and the second resin layer constituting the upper insulating layer, and the via conductor fills the groove while invading in the groove. For this reason, a part of the via conductor invading in the groove serves as a wedge, and the via conductor is strongly, firmly locked into the via hole. Thus, even though thermal stress caused by a difference between the thermal expansion coefficients of the upper insulating layer and the via conductor is repeatedly applied to the wiring board, cracks can be advantageously prevented from being formed between the via conductor and the lower wiring conductor connected thereto. As a result, a wiring board reliable in electric connection between the via conductor and the lower wiring conductor connected thereto can be provided.

DETAILED DESCRIPTION OF EXEMPLARY EMBODIMENT

Figure 1:
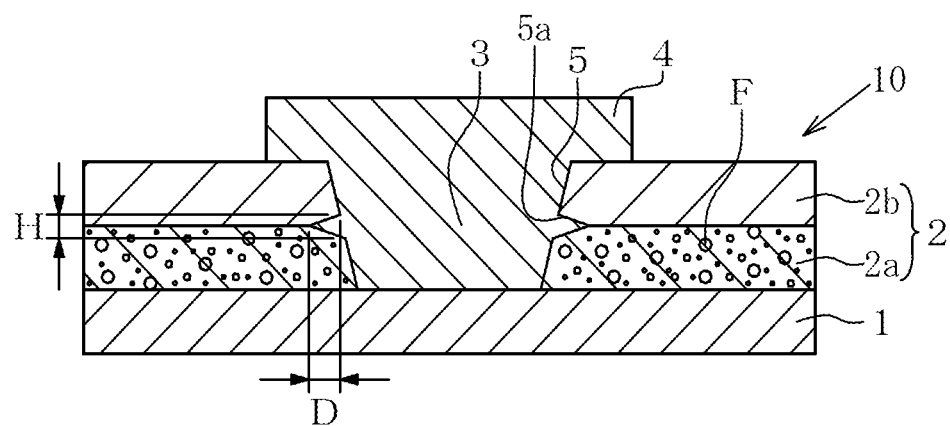
FIG. 1 is a main schematic sectional view showing an embodiment of a wiring board according to the present invention.

An embodiment of a wiring board according to the present invention will be described below with reference to the accompanying drawings. As shown in FIG. 1, a wiring board 10 has a lower wiring conductor 1, an upper insulating layer 2, a via conductor 3, and an upper wiring conductor 4. The via conductor 3 and the upper wiring conductor 4 are integrated with each other.

The wiring conductor 1 is mainly made of, for example, a copper plating layer or copper foil. The lower wiring conductor 1 is formed on a lower insulating layer (not shown). The thickness of the lower wiring conductor 1 ranges from, for example, about 2 to 50 μm.

The insulating layer 2 is composed of a first resin layer 2a and a second resin layer 2b. The first resin layer 2a is made by containing about 30 to 80 vol. % of an inorganic insulating filler F in a thermosetting resin such as an epoxy resin or a polyimide resin or a thermoplastic resin. The thickness of the first resin layer 2a is about 3 to 10 μm on the lower wiring conductor 1. The first resin layer 2a preferably has a Young's modulus of 5 to 10 GPa and preferably has a thermal expansion coefficient of 0 to 40 ppm/° C. (30 to 150° C.)

The second resin layer 2b is made of a thermosetting resin such as an epoxy resin or a polyimide resin or a thermoplastic resin and contains no inorganic insulating filler or contains less than 30 vol. % of the inorganic insulating filler. The thickness of the second resin layer 2b ranges from about 1 to 5 μm. The second resin layer 2b preferably has a Young's modulus of 0.5 to 4 GPa and preferably has a thermal expansion coefficient of 50 to 100 ppm/° C. (30 to 150° C.)

As the inorganic insulating fillers contained in the first resin layer 2a and the second resin layer 2b, for example, silicon dioxide (silica), aluminum oxide, aluminum nitride, aluminum hydroxide, calcium carbonate, and the like are given. In particular, silica is preferably used. The inorganic insulating fillers contained in the first resin layer 2a and the second resin layer 2b, respectively, may be of the same type or of the different types. The inorganic insulating filler F preferably has a grain diameter of about 1 to 4 μm and a spherical shape.

A via hole 5 including the lower wiring conductor 1 as a bottom surface is formed in the insulating layer 2. The via hole 5 has a substantially inverted crucible-former shape, and a diameter of about 8 to 40 μm at the lower end and about 10 to 50 μm at the upper end. The via hole 5 has an annular groove 5a formed by horizontally recessing the inner wall of the via hole 5 over its whole circumference in a boundary between the first resin layer 2a and the second resin layer 2b. The groove 5a has a height H of about 3 to 10 μm at the opening, the recessed portion having a depth D of about 2 to 8 μm, and an interval between the upper and lower surfaces, the interval becoming narrow toward the back of the groove 5a.

The via conductor 3 fills the via hole 5 in the insulating layer 2, and a wiring conductor 4 is caused to adhere onto the upper insulating layer 2. The via conductor 3 and the upper wiring conductor 4 are integrated with each other, and are mainly made of, for example, a copper plating conductor. The thickness of the upper wiring conductor 4 ranges from about 2 to 8 μm on the upper insulating layer 2.

The via conductor 3 tightly fills the via hole 5 and partially invades into the groove 5a. For this reason, a part of the via conductor 3, which invades in the groove 5a, serves as a wedge, and the via conductor 3 is strongly locked into the via hole 3. Thus, even though thermal stress caused by a difference between the thermal expansion coefficients of the upper insulating layer 2 and the via conductor 3 is repeatedly applied to the wiring board 10, cracks can be advantageously prevented from being formed between the via conductor 3 and the lower wiring conductor connected thereto. As a result, a wiring board 10 that is excellent in reliability of the electric connection between the via conductor 3 and the lower wiring conductor 1 can be provided.

When the height H of the aperture of the groove 5a is less than 3 μm, the via conductor 3 is difficult to be caused to preferably invade into the groove 5a. When the height H is more than 10 μm, such a groove 5a is difficult to be formed. Thus, the height H of the aperture of the groove 5a preferably ranges from 3 to 10 μm.

When a depth D of the groove 5a is less than 2 μm, the via conductor 3 invading in the groove 5a is slightly effected as the wedge, and the via conductor 3 is difficult to be sufficiently strongly locked into the via hole 5. In contrast to this, when the depth D exceeds 8 μm, such a groove 5a is difficult to be formed. Thus, the depth D of the groove 5a preferably ranges from 2 to 8 μm.

Furthermore, when the first resin layer 2a has a Young's modulus of 5 to 10 GPa and a thermal expansion coefficient of 0 to 40 ppm/° C. (30 to 150° C.), the bottom of the via conductor 3 can be strongly held in the via hole 5. For this reason, even though great stress is generated between the via conductor 3 and the lower wiring conductor 1, peeling can be advantageously prevented from occurring between the via conductor 3 and the lower wiring conductor 1. Furthermore, when it is assumed that the second resin layer 2b has a Young's modulus of 0.5 to 4 GPa, stress applied to the upper part of the via conductor 3 can be preferably moderated by elastically transforming the second resin layer. Thus, the first resin layer 2a preferably has a Young's modulus of 5 to 10 GPa and a thermal expansion coefficient of 0 to 40 ppm/° C. (30 to 150° C.). The second resin layer 2b preferably has a Young's modulus of 0.5 to 4 GPa.

In order to obtain the first resin layer 2a having a Young's modulus of 5 to 10 GPa and the second resin layer 2b having a Young's modulus of 0.5 to 4 GPa, a method of adjusting the contents of the inorganic insulating fillers contained in the first resin layer 2a and the second resin layer 2b is employed. In this case, when the contents of the inorganic insulating fillers are increased, the Young's modulus increase. In contrast to this, when the contents of the inorganic insulating fillers are decreased, the Young's modulus decrease. In order to obtain the first resin layer 2a having a thermal expansion coefficient of 0 to 40 ppm/° C. (30 to 150° C.), a method of adjusting the thermal expansion coefficient by adjusting the content of the inorganic insulating filler contained in the first resin layer 2a is employed. In this case, when the content of the inorganic insulating filler is increased, the thermal expansion coefficient of the first resin layer 2a decreases. When the content of the inorganic insulating filler is decreased, the thermal expansion coefficient of the first resin layer 2a increases.

Figure 2A:
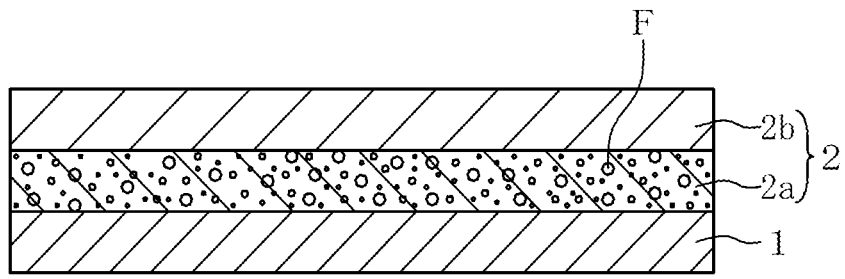
FIGS. 2A to 2D are main schematic sectional views of steps for explaining a method of manufacturing the wiring board shown in FIG. 1.

A method of manufacturing the wiring board 10 described above will be described below with reference to accompanying FIGS. 2A to 2D. As shown in FIG. 2A, the upper insulating layer 2 including the first resin layer 2a and the second resin layer 2b is laminated on the lower wiring conductor 1. In the first resin layer 2a, as described above, a thermosetting resin such as an epoxy resin or a polyimide resin or a thermoplastic resin contains about 30 to 80 vol. % of the inorganic insulating filler F such as silica. The first resin layer 2a preferably has a Young's modulus of 5 to 10 GPa and preferably has a thermal expansion coefficient of 0 to 40 ppm/° C. (30 to 150° C.). In the second resin layer 2b, the inorganic insulating filler F such as silica is not contained in the same resin as that of the first resin layer 2a, or less than 30 vol. % of inorganic insulating filler F is contained in the resin. The second resin layer 2b preferably has a Young's modulus of 0.5 to 4 GPa and preferably has a thermal expansion coefficient of 50 to 100 ppm/° C. (30 to 150° C.)

When the first resin layer 2a and the second resin layer 2b are made of, for example, a thermosetting resin, a method of preparing an unset or semi-set thermal setting resin sheet containing 30 to 80 vol. % of the inorganic insulating filler F and an unset or semi-set thermosetting resin sheet containing no inorganic insulating filler F or less than 30 vol. % of the inorganic insulating filler F, sequentially laminating the resin sheets, and then thermally setting the resin sheets is employed. Alternatively, a method of laminating a laminated resin sheet obtained by alternately laminating the resin sheets in advance on the lower wiring conductor 1 and thermally setting the laminated resin sheet is employed.

Figure 2B:
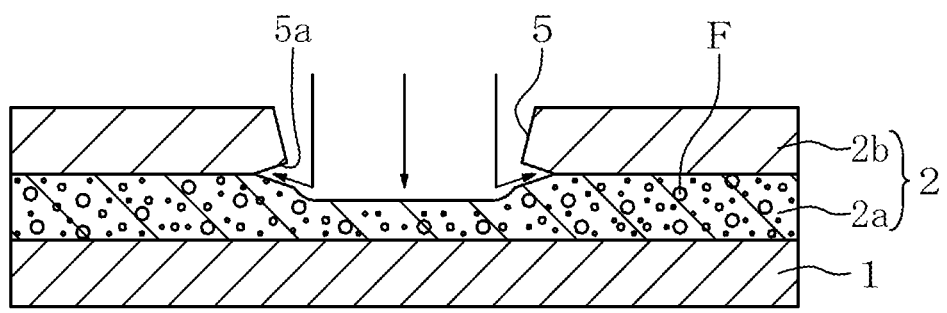

As shown in FIG. 2B, a laser is irradiated from the upper side of the upper insulating layer 2 in the direction of arrows to form some of the via holes 5 in the second resin layer 2b, and the laser is partially reflected by the first resin layer 2a to form the groove 5a in the boundary between the first resin layer 2a and the second resin layer 2b. At this time, since the first resin layer 2a contains 30 to 80 vol. % of the inorganic insulating filler F made of silica, the laser irradiating the inorganic insulating filler F is also reflected in a horizontal direction, the reflected laser enters along the boundary between the first resin layer 2a and the second resin layer 2b to form the groove 5a. When the content of the inorganic insulating filler F contained in the first resin layer 2a is less than 30 vol. %, a part of the laser cannot be sufficiently reflected by the first resin layer 2a. Thus, the groove 5a tends to be difficult to be preferably formed in the boundary between the first resin layer 2a and the second resin layer 2b. In contrast to this, when the content of the inorganic insulating filler F exceeds 80 vol. %, the processability and strength of the first resin layer 2a tend to be poor. Thus, the content of the inorganic insulating filler F contained in the first resin layer 2a preferably ranges from 30 to 80 vol. %. When the second resin layer 2b contains 30 vol. % or more of the inorganic insulating filler, a laser is largely reflected by the second resin layer 2b, and a part of the laser reflected by the first resin layer is hard to be caused to enter along the boundary between the first resin layer 2a and the second resin layer 2b. Thus, the groove 5a cannot be easily formed. Thus, the second resin layer 2b preferably contains no inorganic insulating filler F or preferably contains less than 30 vol. % of the inorganic insulating filler F.

Figure 2C:
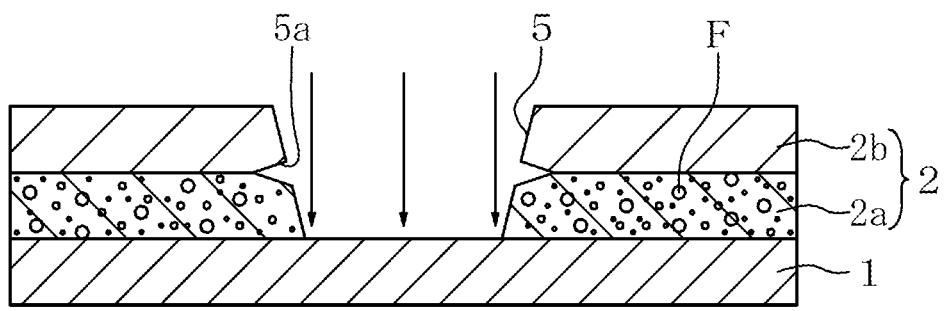

Subsequently, as shown in FIG. 2C, a laser is irradiated the first resin layer 2a in the direction of arrows to form the via hole 5. At this time, a part of the laser is reflected by the first resin layer 2a and scattered. However, since the scattered laser is reflected by the surrounding inorganic insulating filler F and repeatedly scattered to be weakened, the laser is not widely diffused in the horizontal direction on the first resin layer 2a. Thus, the via hole 5 having a substantially inverted crucible-former shape is formed while holding the groove 5a in only the boundary between the first resin layer 2a and the second resin layer 2b.

Figure 2D:
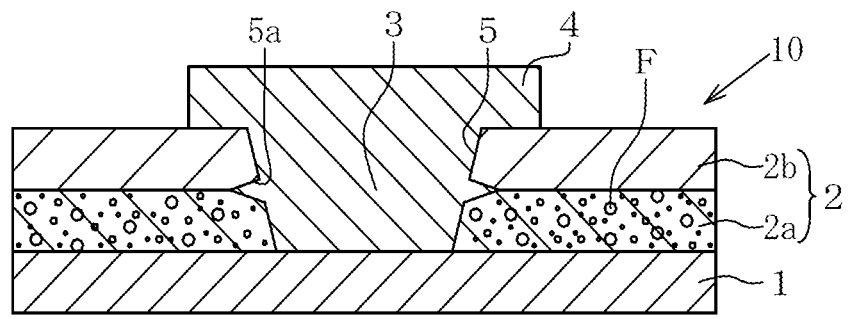
Figure 3:
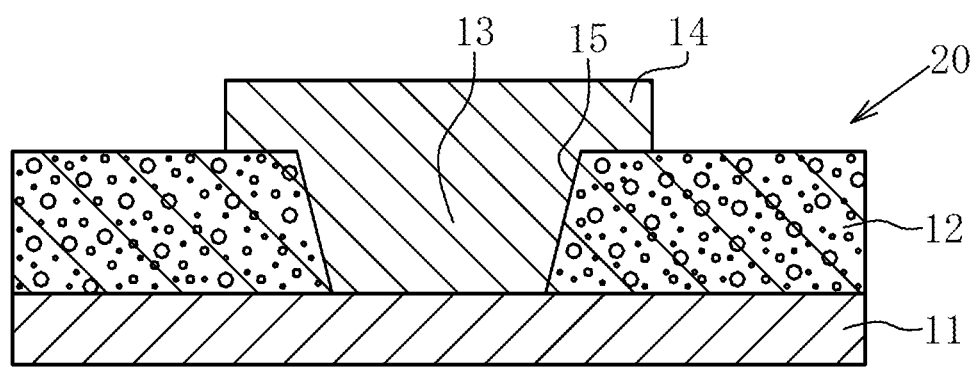
FIG. 3 is a main schematic sectional view showing a conventional wiring board.

As shown in FIG. 2D, the via conductor 3 fills the via hole 5, and the upper wiring conductor 4 is formed on the via conductor 3 and the upper insulating layer 2. The via conductor 3 and the upper wiring conductor 4 are integrated with each other. The via conductor 3 fills the via hole 5 while invading in the groove 5a. In this manner, the via conductor 3 fills the via hole 5 while invading in the groove 5a. For this reason, a part of the via conductor 3 invading in the groove 5a serves as a wedge, and the via conductor 3 is strongly, and firmly locked into the via hole 5. Thus, even though thermal stress caused by a difference between the thermal expansion coefficients of the upper insulating layer 2 and the via conductor 3 is repeatedly applied to the wiring board, cracks can be advantageously prevented from being formed between the via conductor 3 and the lower wiring conductor 1. Thus, the wiring board 10 that is excellent in reliability of electric connection between the via conductor 3 and the lower wiring conductor 1 can be provided.

Furthermore, when the first resin layer 2a has a Young's modulus of 5 to 10 GPa and a thermal expansion coefficient of 0 to 40 ppm/° C. (30 to 150° C.), the bottom of the via conductor 3 can be strongly held in the via hole 5. Even though strong stress is generated between the via conductor 3 and the lower wiring conductor 1, peeling can be advantageously prevented from occurring between the via conductor 3 and the lower wiring conductor 1. When it is assumed that the second resin layer 2b has a Young's modulus of 0.5 to 4 GPa, stress that is applied to the upper part of the via conductor 3 can be preferably moderated by elastically transforming the second resin layer 2b. Thus, the first resin layer 2a preferably has a Young's modulus of 5 to 10 GPa and a thermal expansion coefficient of 0 to 40 ppm/° C. (30 to 150° C.). The second resin layer 2b preferably has a Young's modulus of 0.5 to 4 GPa.

The via conductor 3 and the upper wiring conductor 4 are mainly made of a copper plating conductor, and are formed by a method of causing an underlying metal layer having a thickness of 0.05 to 1 µm to adhere to the inside of the via hole 5 and the surface of the upper insulating layer 2 by, for example, an electroless plating method or a sputtering method to deposit an electrolytic plating conductor on the underlying metal layer. As the underlying metal layer, copper, nickel, chromium, titanium, or the like is preferably used. As the electrolytic plating conductor, copper is preferably used.

As described above, the preferable embodiment of the wiring board according to the present invention and the method of manufacturing the same has been explained. The present invention is not limited to only the embodiment described above, and various changes and modifications can be effected as a matter of course.

What is claimed is:

1. A wiring board comprising:
   a lower wiring conductor;
   an upper insulating layer laminated on the lower wiring conductor and having a via hole where a bottom surface is the lower wiring conductor; and
   a via conductor connected to the lower wiring conductor and filling the via hole, wherein
   the upper insulating layer includes at least a first resin layer laminated on the lower wiring conductor and a second resin layer laminated on the first resin layer, wherein the first resin layer has a Young's modulus of 5 to 10 GPa, and a thermal expansion coefficient of 0 to 40 ppm/° C. (30 to 150° C.), and contains 51 to 80 vol. % of an inorganic insulating filler, and the second resin layer has a Young's modulus of 0.5 to 4 GPa, the via hole has an annular groove formed by recessing an inner wall of the via hole over a whole circumference of the inner wall in a boundary between the first resin layer and the second resin layer, and the via conductor filling the via hole also fills the groove while invading in the groove.

2. The wiring board according to claim 1, wherein the second resin layer contains no inorganic insulating filler or contains less than 30 vol. % of the inorganic insulating filler.

3. The wiring board according to claim 2, wherein the inorganic insulating filler is spherical silica particles having grain diameters of 1 to 4 µm.

4. The wiring board according to claim 2, wherein the inorganic insulating filler is silica.

\* \* \* \* \*